United States Patent [19]

Peppiette et al.

[11] Patent Number: 5,469,095
[45] Date of Patent: Nov. 21, 1995

[54] BRIDGE CIRCUIT FOR DRIVING AN INDUCTIVE LOAD WITH A SHOOT-THROUGH PREVENTION CIRCUIT

[75] Inventors: Roger Peppiette, Shrewsbury, Mass.; Alberto Bilotti, Florida, Argentina

[73] Assignee: Allegro Microsystems, Inc., Worcester, Mass.

[21] Appl. No.: 265,854

[22] Filed: Jun. 27, 1994

[51] Int. Cl.[6] .................... H03K 19/094; G05F 1/46
[52] U.S. Cl. .................... 327/110; 327/108; 327/427; 327/309; 361/153; 361/159; 326/21
[58] Field of Search ............... 327/1, 77, 94, 327/103, 108, 109, 110, 306, 309, 390, 424, 427, 423, 480, 494, 496, 497, 509, 513, 530, 579, 588, 108–112; 363/17, 53, 98, 132; 361/153, 155, 159; 326/21

[56] References Cited

U.S. PATENT DOCUMENTS

| | | | |
|---|---|---|---|
| 4,316,243 | 2/1982 | Archer | 363/132 |
| 4,545,004 | 10/1985 | Kade et al. | 363/63 |
| 4,566,059 | 1/1986 | Gallios et al. | 363/17 |
| 4,603,268 | 7/1986 | Davis | 307/559 |
| 4,607,322 | 8/1986 | Henderson | 363/56 |
| 4,680,664 | 7/1987 | Leuthen | 361/91 |
| 4,742,208 | 5/1988 | Overman | 219/137 PS |
| 4,783,714 | 11/1988 | Kalina | 361/101 |
| 4,829,415 | 5/1989 | Haferl | 363/26 |
| 4,970,620 | 11/1990 | Lehnhoff et al. | 361/18 |
| 4,982,107 | 1/1991 | Fayfield | 307/236 |

Primary Examiner—Timothy P. Callahan
Assistant Examiner—Kenneth B. Wells

[57] ABSTRACT

A bridge circuit, intended for use as a PWM driver of an inductive load, includes at least one source driver transistor connected in series totem-pole fashion with a sink driver transistor. A base resistor is connected from base to emitter of one of the driver transistors. This totem pole circuit is connected across a pair of DC supply conductors. A protective fly-back diode is connected across the one driver transistor. An auxiliary resistor is connected from the base of the auxiliary transistor to the emitter of the one driver transistor. When a fly-back diode across the one driver transistor conducts, the one driver transistor tends to conduct in the reverse direction and to store charge that in a subsequent period leads to shoot-through currents through the source and sink drivers. The auxiliary transistor turns on only when the fly-back diode conducts and shunts the base-collector of the source transistor, preventing its turning on and storing charge, and thus preventing potentially damaging shoot-through current through the driver transistors. The added auxiliary components do not cause additional power being drawn from the supply source, and therefore do not cause additional heating in the integrated circuit in which the bridge circuit may be formed. A pair of such half wave totem pole circuits may be paralleled to form a full wave bridge.

12 Claims, 2 Drawing Sheets

5,469,095

BRIDGE CIRCUIT FOR DRIVING AN INDUCTIVE LOAD WITH A SHOOT-THROUGH PREVENTION CIRCUIT

BACKGROUND

This invention pertains to bridge circuits, having bipolar source drivers, intended for driving inductive loads, and more particularly to such a bridge circuit wherein each source driver has an associated auxiliary bipolar transistor for when the base-collector junction of a source transistor is momentarily forward biassed, preventing charge storage in the source transistor, and thus preventing transient shoot-through currents.

Referring to FIG. 1, a conventional full-wave bridge circuit has two NPN source drivers 12 and 13 having their collectors connected to a positive DC supply conductor 11. Two NPN sink drivers 16 and 17 are also provided having their emitters connected to a circuit ground conductor 21, which is normally connected to the circuit ground either directly or otherwise through a switch, a current sensing resistor, etc. Bridge-control input conductors 14, 15, 18 and 19 are connected to the bases of the driver transistors. An inductive load 20 is connected between the emitters of the source drivers 12 and 13 as well as being connected between the collectors of the sink drivers 16 and 17.

In a bridge driver which has an inductive motor load and is operated in a pulse width modulated (PWM) mode, there is a transient shoot-through current condition which can occur when a bipolar bridge sink driver transistor turns on. For example, inductive load 20 may be a motor, and during sink side PWM control of the motor 20, signals are applied to the four bases of the four transistor drivers so that drivers 12 and 17 are turned off, and driver 13 is turned on, all during the time while driver 16 is pulse width modulated (PWM) on and off at a duty factor to drive the motor 20 at a desired speed. With driver 12 off and driver 16 operating in the PWM chop mode, the inductive load terminal 22 will be connected (via the on driver 13) continuously to the positive DC supply voltage, Vbb, while the inductive load terminal 24 will alternate between ground voltage (zero) plus Vsat of the driver 16 (e.g. 0.1 volt) and a voltage more positive than Vbb which is attributable to the inductor 20 causing the current which was formerly flowing in driver 16 to flow through the forward biased diode 26.

Thus each time the sink driver turns off, the motor terminal 24 becomes greater than Vbb and the protective diode 26 conducts. At this time, the base-collector junction of the source driver 12 will also become forward biased, because the base of source driver 12 is connected via resistor 28 to motor terminal 24. This later condition results in the driver transistor 12 turning on in the inverse direction which results in the storage of charge in the base of driver 12. If the pulse width modulated sink driver 16 turns on while diode 26 conducts, then the stored charge causes the driver 12 to turn on transiently in the forward direction. Thus a large transient current may be produced between Vbb and ground through turned-on driver 16 and momentarily turned-on driver 12. This transient shoot-through current occurs repeatedly during the PWM operation of sink driver 16, and results in greater demands on the power supply and in the case that the bridge driver is in an integrated circuit, produces unwanted concentrations of heat there.

In the patent to Alberto Bilotti, U.S. Pat. No. 5,075,568 issued Dec. 24, 1991 and assigned to the same assignee as is the present invention, there is described a protective circuit for clamping the bases of source driver transistors to prevent voltages applied thereto from rising above the supply voltage Vbb, and thus preventing the above-described unwanted shoot-through currents. During those moments when the diode 26 is forward biased by a voltage $V_{26}$, the clamping current is driven by the inductive load 20 from the supply voltage Vbb, through the turned-on driver 13, the load 20, the resistor 28 and then through a clamping circuit to ground. This clamping circuit holds the base of transistor 12 at a potential approximately equal to Vbb, thereby preventing the base collector junction of transistor 12 from forward biassing. This causes a power loss, $P_{clamp}$, from the current in the resistor 28 such that $$P_{clamp} = \frac{V_{26}}{R_{28}} Vbb.$$

In situations wherein Vbb is large and the resistance $R_{28}$ of resistor 28 is small, this additional power loss and commensurate heating in an integrated circuit can be significant when the bridge is used for driving an inductive load in a micro stepping mode.

SUMMARY OF THE INVENTION

It is an object of this invention to provide an improved full-wave bridge driver circuit having bipolar source drivers wherein an auxiliary circuit associated with each source driver prevents transient shoot-through currents through bridge pairs of sink and source drivers, and produces insignificant additional power dissipation.

It is a further object of this invention to provide such a bridge circuit wherein an auxiliary transistor is shunt connected across the base-collector junction of each source driver transistor for preventing turn on of the source driver in the inverse direction when the associated fly-back diode is conducting and preventing charge storage therein.

A half wave bridge circuit of the kind intended for driving an inductive load, includes a positive voltage supply conductor and a ground conductor, a load terminal, an NPN source driver transistor connected collector-to-emitter between the supply conductor and the load terminal, an NPN sink driver transistor connected collector-to-emitter between the load terminal to the ground conductor, a bridge-control source-input conductor connected to the base of the source driver transistor, and a bridge-control sink-input conductor connected to the base of the sink driver transistor.

A fly-back diode is connected cathode-to-anode across one of the driver transistors collector-to-emitter. A base resistor is connected between the base and the emitter of the one driver transistor. An auxiliary protective NPN transistor has a collector connected to the collector of the one driver transistor, and has an emitter connected to the base of the one driver transistor. An auxiliary resistor is connected from the base of the auxiliary transistor to the emitter of the one driver transistor. The resistance values of the base and auxiliary resistors are about equal, preferably having a ratio lying between 0.8 and 1.2.

In one particular embodiment, a half wave bridge circuit, or totem pole driver circuit, includes a positive voltage supply conductor and a ground conductor. An NPN source transistor has a collector connected to the supply conductor, and a fly-back diode is connected cathode-to-anode across the source transistor collector-to-emitter. A base resistor is connected from the base to the emitter of the source tran-

3 sistor, and a sink transistor is connected from the emitter of the source transistor to the ground conductor. A load terminal is connected to the emitter of the source transistor.

An auxiliary protective NPN transistor has a collector connected to the supply conductor, and has an emitter connected to the base of the source transistor. An auxiliary resistor is connected between the base of the auxiliary transistor and the emitter of the source transistor. The auxiliary NPN transistor has a substantially smaller physical size than that of the NPN source transistor. The resistance values of the base resistor and the auxiliary resistor are approximately equal to force the current gain of the auxiliary transistor to have a gain of approximately one.

In another particular embodiment, a full wave bridge consists of two of the above-described half wave bridge circuits wherein the inductive load may be connected between the two load terminals of the two half wave bridge circuits.

The auxiliary transistor turns on in the inverse direction, with its base current provided by the auxiliary resistor, when the fly-back diode becomes forward biassed by the inductive load, to shunt the base-collector junction of the source transistor and prevent it from turning on in the inverse direction.

In this manner, no charge is stored in the source transistor during periods when the fly-back diode is forward biassed, and consequently there will be no shoot-through current through the source and sink driver transistors in the following period when the sink driver is turned on. Neither does the auxiliary transistor draw any additional current from the supply source and thus no additional heat is generated.

According to another embodiment of the invention, a full wave bridge circuit of the kind intended for driving an inductive load, includes a positive voltage supply conductor and a ground conductor. First and second NPN source transistors have their collectors connected to the supply conductor and a pair of fly-back diodes is connected cathode-to-anode across the respective source drivers collector-to-emitter. First and second base resistors are connected between the base and emitter respectively of the first and second source transistors. First and second sink transistors are connected respectively from the emitters of the first and second source transistors to the ground conductor. Two load terminals are connected respectively to the emitters of the source transistors.

First and second auxiliary protective NPN transistors have collectors connected to the supply conductor and having emitters connected respectively to the bases of the first and second source transistors. The auxiliary NPN transistors have a substantially smaller physical size than that of the NPN source transistors, and first and second auxiliary resistors are connected from the bases respectively of the first and second auxiliary transistors to the emitters of the first and second source transistors. The resistance values of the first and second auxiliary resistors are approximately equal to those respectively of the first and second base resistors.

A bridge circuit of this invention may additionally include a PNP active clamp transistor connected emitter-to-collector between the base of the auxiliary protective transistor and the ground conductor, and with the clamp-transistor base connected to the emitter of the source transistor. This clamp transistor is a conservative feature for obviating the possibility that a transient current flowing through the auxiliary resistor will cause both of the corresponding auxiliary and source transistors to turn on in the forward direction.

4
BRIEF DESCRIPTION OF THE DRAWINGS

DESCRIPTION OF THE PREFERRED EMBODIMENTS

Figure 1:
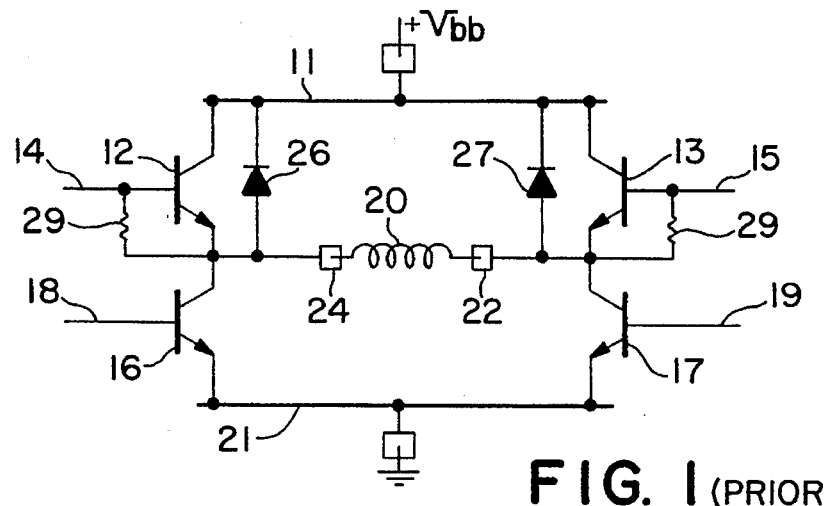
FIG. 1 shows a full-wave bridge circuit of the prior art having an inductive load connected to the bridge output.
Figure 2:
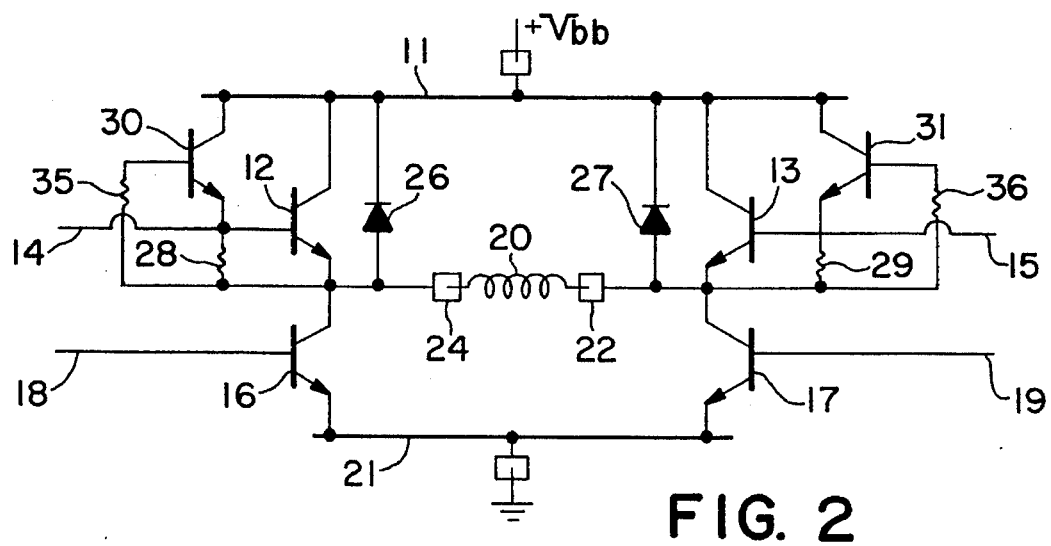
FIG. 2 shows a full-wave bridge circuit with an auxiliary shoot-through protection circuit of this invention, having an inductive load connected thereto.

The bridge circuit of FIG. 2 has corresponding bridge components designated by the same numerals as those in the bridge circuit of FIG. 1. Two resistors 28 and 29 are connected, between the base and emitter of each of the source transistors 12 and 13, respectively. Two fly-back diodes 26 and 27 are connected, respectively, across the two source transistors 12 and 13, emitter to collector.

A first auxiliary NPN transistor 30 has a collector tied to the collector of the source transistor 12, and has an emitter connected to the base of the source transistor 12. Likewise, a second auxiliary NPN transistor 31 has a collector tied to the collector of the source transistor 13, and has an emitter connected to the base of the source transistor 13. The physical size of the two auxiliary transistors 30 and 31 are preferably at least one order of magnitude less than that of the corresponding of the two source transistors 12 and 13, since they are required to handle much smaller currents than the driver transistors, and because they preferably have a minimum of capacitance, collector to base.

During a normal period of operation when the source transistor 12 is turned on in the forward direction by a positive signal voltage applied to its base, the auxiliary transistor 30 will be held off owing to the Vbe drop (about 0.6 volts) across the base-emitter junction of conducting source transistor 12, which Vbe drop is applied via resistor 35 across the base emitter junction of auxiliary transistor 30 in a direction to bias transistor 30 off.

In a following period when the source transistor 12 is turned off and the fly-back diode 26 is forward biassed to clamp the voltage at load terminal 24 to a value above Vbb. In the absence of auxiliary transistor 30, this high voltage would be applied via resistor 28 to the base of source transistor 12 and turn it on in the inverse direction, as explained above.

A resistor 35 is connected between the emitter of transistor 12 and the base of transistor 30. Likewise, a resistor 36 is connected between the emitter of transistor 13 and the base of transistor 31. Thus in the above-noted period when the fly-back diode 26 is forward biassed and the source transistor 12 tends to become turned on in the inverse direction, the high voltage at terminal 24 is applied via resistor 35 to the base of auxiliary transistor 30.

This high voltage at the base of transistor 30 being higher than Vbb by an amount equal to the voltage drop across the forward conducting fly-back diode 26, causes transistor 30 to turn on in the inverse direction and to saturate, thereby shunting the base-to-collector junction of transistor 12, preventing it from turning on in the inverse direction. In this manner, source transistor 12 is prevented from turning on. Thus no charge storage in source transistor 12 takes place, and the unwanted shoot-through current through driver transistors 12 and 16 does not occur.

Proper performance of auxiliary transistor 30, as just described, is assured when its inverse current gain is approximately unity under the conditions that the values of resistors 28 and 35 are equal which makes the base and collector currents equal in transistor 30 at the point where the auxiliary transistor 30 has a low enough voltage collector-to-emitter to effect the turning off of driver transistor 12. As long as the characteristic current gain of auxiliary transistor 30 were higher than unity, it would be forced in this circuit to have a gain that is a function of the ratio of resistance values of resistors 28 and 35.

In the preferred situation, when these resistance values are equal, the base and emitter currents are essentially equal, and the current gain of transistor 30 is forced to become unity.

It is preferred that the values of resistors 28 and 35, and the values of resistors 29 and 36 be about equal, i.e. the resistance ratio equals 1.0±0.2, because the reverse gain of an NPN is typically less than 10 and often much lower. The resistors being close to the same value provides a forced low gain in the reverse mode of operation of the auxiliary transistors 30 and 31. This sets the minimum acceptable forced value of the auxiliary transistor 30 at a little over unity so that when activated, transistor 30 will always saturate to provide maximum protection against shoot-through current spikes.

However, the resistance of resistor 35 should not be reduced substantially toward zero in the interest of reducing the resistance ratio to below unity because a large excess charge storage in the base of auxiliary transistor 30 could then occur which cannot be removed quickly through resistor 35 when the sink driver transistor 16 turns back on. This could lead to a shoot-through current spike through driver transistors 12 and 16 that may be even worse than if auxiliary transistor 30 did not exist.

Figure 3:
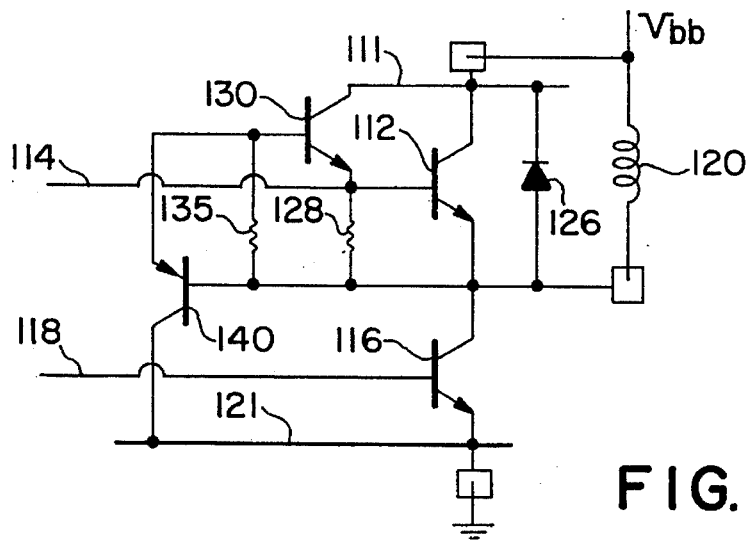
FIG. 3 shows a portion of a half-wave bridge circuit of this invention wherein there is added an active clamp transistor associated with an auxiliary protective transistor.

Referring to FIG. 3, a half-wave bridge circuit, or totem pole circuit, serves as a PWM driver for an inductive load 120. The shoot-through problem here is exactly the same as for the full-wave bridge shown in FIG. 2, and the components in FIGS. 3 and 4 are assigned the same numerals plus 100, as for the corresponding components shown in the left hand side of FIG. 2.

Figure 4:
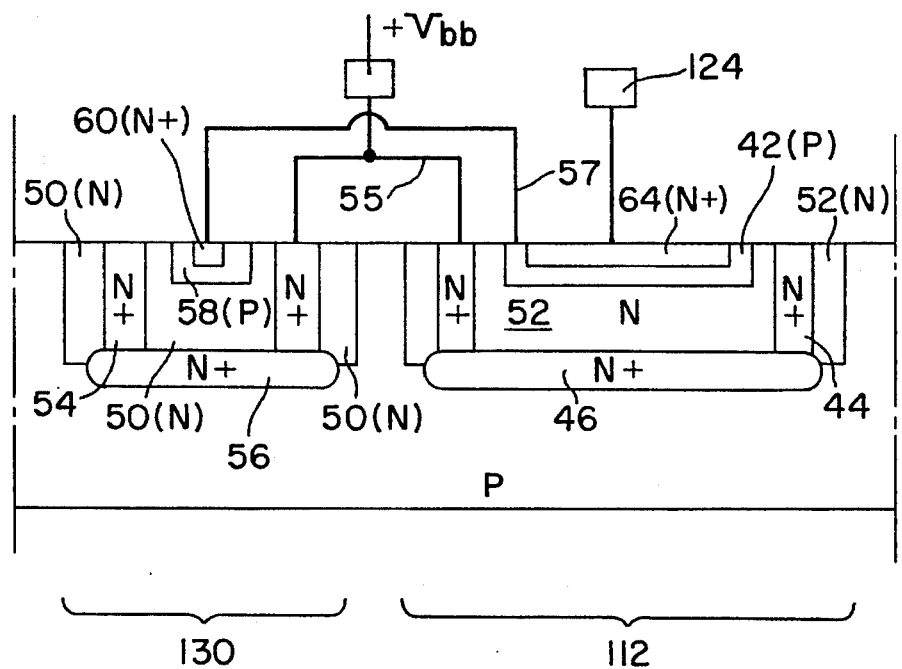
FIG. 4 shows in side sectional view a portion of an integrated circuit including a part of the half-wave bridge of FIG. 3 that includes a source driver transistor and the associated auxiliary transistor.

Referring to FIG. 4, the source transistor 112 has a base region 42 that is completely surrounded by an N+ plug 44 connecting to an N+ buried layer 46. It is additionally desirable to maximize the reverse gain of the auxiliary transistor 130 (and the reverse gains of auxiliary transistors 30 and 31 of FIG. 2), to insure that the reverse gain of each auxiliary transistor is always greater than the forced gain of approximately unity. This may be accomplished by employing in the N-type epitaxial island 50 an N+ plug 54 and an N+ buried layer 56 that together completely surround the base region 58 of the auxiliary transistor 130.

An electrical conductor 57 connects the emitter 60 of the auxiliary transistor 130 to the base 42 of the source transistor 112. Conductor 59 connects the emitter 64 of the source transistor 112 to the load terminal 124.

It will also be seen in FIG. 4 that the N-type islands 50 and 52, in which the auxiliary transistor 130 and the source driver 112 are formed, serve as the collectors of those two transistors and are connected together via electrical conductor 55. In an alternative construction, the auxiliary transistor 130 may be formed in the same island 50 in which the large source transistor 112 is formed, and the electrical conductor 55 may be eliminated (not shown).

Although the configuration of the circuit between transistors 112 and 130 is that of the well known Darlington circuit, the circuit position of the resistor 135, and the approximately equal values of resistors 128 and 135, are not standard. In a standard power Darlington circuit, the value of the resistor connected to the base of the pre-driver is usually considerably higher than the resistor connected to the base of the power driver. And, the input conductor of a standard Darlington circuit is connected to the base of the first of the two transistors, unlike in the circuit of FIGS. 2 and 3 wherein the input conductor (e.g. 114) is connected to the base of the final transistor (e.g. source driver 112).

Toward avoiding a situation wherein a transient will cause transistors 112 and 130, or 12 and 30, to both be temporarily turned on in forward mode, a PNP transistor 40 may be added as shown in FIG. 3. Transistor 40 will act as an active clamp to prevent any possibility of transistors 112 and 130 both turning on in forward mode at the same time.

Figure 5:
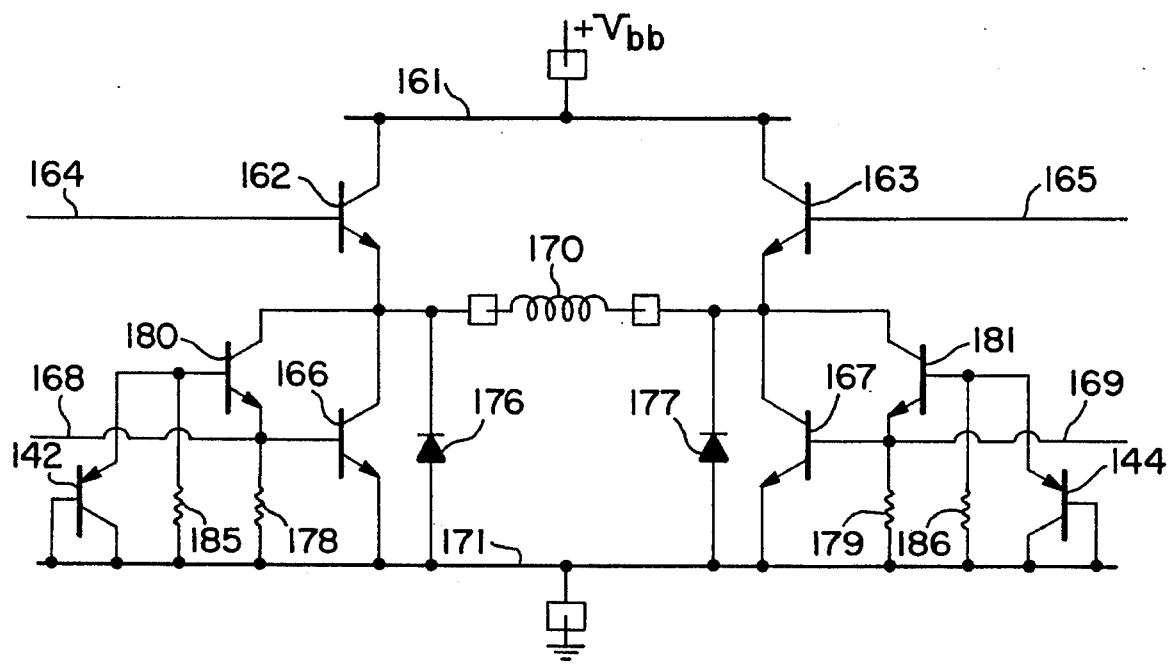
FIG. 5 shows another full-wave bridge circuit with an auxiliary shoot-through protection circuit of this invention.

Referring to FIG. 5, a conventional full-wave bridge circuit has two NPN source drivers 162 and 163 having their collectors connected to a positive DC supply conductor 161. Two NPN sink drivers 166 and 167 are also provided having their emitters connected to a circuit ground conductor 171, which is normally connected to the circuit ground either directly or otherwise through a switch, a current sensing resistor, etc. Bridge-control input conductors 164, 165, 168 and 169 are connected to the bases of the driver transistors. A pair of diodes 176 and 177 are connected across each of the two sink drivers 166 and 167. An inductive load 170 is connected between the emitters of the source drivers 162 and 163 as well as being connected between the collectors of the sink drivers 166 and 167.

The full wave bridge driver of FIG. 5 may be operated in a micro-stepping mode wherein there is a transient shoot-through current condition which can occur when a bridge source driver transistor turns on in a manner analogous to that described above for the bridge circuit of FIG. 1.

In FIG. 5, this situation occurs when the source drivers, rather than the sink drivers (as in the example for the circuit of FIG. 1, are pulse width modulated, creating the potential for the sink driver to inversely conduct when the corresponding totem-pole source-driver partner turns on. This causes a shoot-through current to flow from the ground conductor 171 to the supply conductor 161, e.g. through source driver 162 and sink driver 166. This transient shoot-through current is attributable to stored base charge in the inverted sink driver, e.g. driver 166.

The full wave bridge circuit having its sink drivers operated in PWM mode, can be protected from such shoot-through currents by use of auxiliary NPN transistors 180 and 181 as shown in FIG. 5, that operates in the same manner as do auxiliary transistors 30 and 31 in the circuit of FIG. 2. Also analogous to the circuit of FIG. 2, the bridge circuit of FIG. 5 include base resistors 178 and 179 connected respectively across the base and emitter of the sink drivers 166 and 167, and include auxiliary resistors 185 and 186 connected respectively between the emitter of each sink driver to the base of the corresponding auxiliary transistor. The resistances of each resistor pair, e.g. pair 178 and 185, are also made approximately equal as in the circuit of FIGS. 2 and 3.

A pair of PNP transistors 144 and 142 are connected for each base respectively of the auxiliary transistors 180 and 181 to prevent the possibility of a sink driver 166 or 167 turning on at the same time as the corresponding auxiliary transistor 180 or 181.

We claim:

1. A half wave bridge circuit for driving an inductive load, of the kind including a positive voltage supply conductor, a ground conductor, a load terminal, an NPN source driver transistor connected collector-to-emitter between said supply conductor and said load terminal, an NPN sink driver transistor connected collector-to-emitter between said load terminal and said ground conductor, a bridge-control source-input conductor to which one bridge-control signal may be directly applied is connected directly to the base of said source driver transistor; a bridge-control sink-input conductor to which another bridge-control signal may be directly applied is connected directly to the base of said sink driver transistor, a fly-back diode connected cathode-to-anode across one of said driver transistors collector-to-emitter; wherein the improvement comprises:

a) a base resistor connected from the emitter to the bridge-control input conductor of said one driver transistor;

b) an auxiliary protective NPN transistor having a collector connected to said collector of said one driver transistor, and having an emitter connected to said bridge-control input conductor of said one driver transistor; and c) an auxiliary resistor connected from said bridge-control input conductor of said one driver transistor to the base of said auxiliary transistor.

2. The half wave bridge circuit of claim 1 wherein the ratio of said approximately equal resistance values of said base and auxiliary resistors is within the range of from 0.8 to 1.2.

3. The half wave bridge circuit of claim 1 wherein the ratio of resistance values of said base and auxiliary resistors is within the range 0.8 to 1.2.

4. The half wave bridge circuit of claim 1 wherein said one driver transistor is said NPN source driver transistor, said half wave bridge circuit additionally comprising a PNP clamp transistor having an emitter connected to said base of said auxiliary protective transistor, having a collector connected to said ground conductor, and having a base connected to said emitter of said NPN source driver transistor.

5. The half wave bridge circuit of claim 4 said auxiliary NPN transistor is has a smaller physical size than that of said NPN source transistor.

6. The half wave bridge circuit of claim 1 wherein said one driver transistor is said NPN sink driver transistor; and additionally comprising a PNP clamp transistor having an emitter connected to said base of said auxiliary protective transistor, having a collector and base connected to said ground conductor.

7. The half wave bridge circuit of claim 1 wherein said auxiliary NPN transistor has a smaller physical size than that of said NPN sink transistor.

8. A full wave bridge circuit for driving an inductive load, of the kind including a positive voltage supply conductor, a ground conductor, first and second NPN source driver transistors respectively having collectors connected to said supply conductor, first and second NPN sink driver transistors respectively having emitters connected to said ground conductor, said first and second source driver transistors having emitters connected respectively to the collectors said first and second sink drivers, first and second output load terminals connected respectively to said first and second source driver emitters, first and second bridge-control source-input conductors to which one pair of bridge-control signals may be applied are connected directly to the bases respectively of said first and second source driver transistors; first and second bridge-control sink-input conductors to which another pair of bridge-control signals may be applied are connected directly to the bases respectively of said first and second sink driver transistors, a first fly-back diode connected cathode-to-anode across one of said first driver transistors collector-to-emitter, a second fly-back diode connected across the corresponding of said second driver transistors collector-to-emitter; wherein the improvement comprises:

a) a first base resistor connected from base to emitter of connected from base to emitter of said corresponding second driver transistor;

b) first and second auxiliary protective NPN transistors having collectors respectively connected to said collectors of said one first and corresponding second driver transistors, and having emitters respectively connected to said bases of said one first and corresponding second driver transistors; and c) first and second auxiliary resistors connected respectively from the bases of said first and second auxiliary transistors to respectively said first and second bridge-control input conductors that are connected respectively to said one first and corresponding second driver transistors.

9. The full wave bridge circuit of claim 8 wherein the ratio of said approximately equal resistance values of said first base resistor and said first auxiliary resistor are with the range of from 0.8 to 1.2; and wherein the ratio of said approximately equal resistance values of said second base resistor and said second auxiliary resistor are with the range of from 0.8 to 1.2.

10. The full wave bridge circuit of claim 8 additionally comprising first and second PNP clamp transistors connected emitter-to-collector from said bases of said respective one first and corresponding second auxiliary transistors to said ground conductor, said clamp transistors having bases respectively connected to said emitters of said one first and second corresponding source transistors.

11. A silicon integrated circuit chip wherein said full wave bridge circuit of claim 8 is formed, comprising, a first isolated island of N-type conductivity being formed in and at a surface of said chip serving as said collector of said first auxiliary transistor, a P-type conductivity region formed in a central portion and at a surface of said first N-type island serving as said first-auxiliary-transistor base, an N-type buried layer formed in said first island and an annular N-type plug formed in said first island extending from said surface to said buried layer to completely surround said first-island base region; and a second isolated island of N-type conductivity spaced away from said first island and being formed in and at a surface of said chip serving as said collector of said second auxiliary transistor, a P-type conductivity region formed in a central portion and at a surface of said second N-type island serving as said second-auxiliary-transistor base, an N-type buried layer formed in said second island and an annular N-type plug formed in said second island extending from said surface to said buried layer to completely surround said second-island base region.

12. A full wave bridge circuit for driving an inductive load, of the kind including a positive voltage supply conductor, a ground conductor, first and second NPN source driver transistors respectively having collectors connected to said supply conductor, first and second NPN sink driver transistors respectively having emitters connected to said ground conductor, said first and second source driver transistors having emitters connected respectively to the collectors said first and second sink drivers, first and second output load terminals connected respectively to said first and second source driver emitters, first and second bridge-control source-input conductors to which one pair of bridge-control signals may be applied are connected directly to the bases respectively of said first and second source driver transistors; first and second bridge-control sink-input conductors to which another pair of bridge-control signals may be applied are connected directly to the bases respectively of said first and second sink driver transistors, a first fly-back diode connected cathode-to-anode across one of said first driver transistors collector-to-emitter, a second fly-back diode connected across the corresponding of said second driver transistors collector-to-emitter; wherein the improvement comprises:

a) first and second base resistors connected from the emitter to the bridge-control input conductors of said one first and corresponding second of said driver transistors, respectively;

b) first and second auxiliary protective NPN transistors having emitters connected respectively to said first and second bridge-control input conductors, and respectively having collectors connected to said collector of said one first and second corresponding driver transistors; and c) first and second auxiliary resistors connected respectively to the bases of said first and second auxiliary transistors from said first and second bridge-control input conductors of said respective one first and corresponding second driver transistors.

* * * * *